United States Patent [19]
LaGrotta et al.

[11] Patent Number: 6,095,482
[45] Date of Patent: Aug. 1, 2000

[54] UNIVERSAL EQUIPMENT MOUNTING STRUCTURE AND METHOD OF USING

[75] Inventors: James T. LaGrotta, Boonton; Richard T. LaGrotta, Livingston, both of N.J.

[73] Assignee: Lucent Technologies, Inc., Murray Hill, N.J.

[21] Appl. No.: 09/152,978

[22] Filed: Sep. 14, 1998

[51] Int. Cl.[7] .................................................... F16M 3/00
[52] U.S. Cl. ...................... 248/672; 108/51.11; 248/678; 248/910
[58] Field of Search ..................................... 248/672, 678, 248/676, 346.01, 346.02, 910; 108/51.11, 55.1, 57.17

[56] References Cited

U.S. PATENT DOCUMENTS

| | | | |
|---|---|---|---|
| 4,191,356 | 3/1980 | Ashmun et al. | 248/678 |
| 5,863,017 | 1/1999 | Larson et al. | 248/678 X |
| 5,894,803 | 4/1999 | Kuga | 108/51.11 |

*Primary Examiner*—Ramon O. Ramirez
*Attorney, Agent, or Firm*—Michael Y. Epstein; Henry I. Schanzar

[57] ABSTRACT

A structure on which various equipment, particularly outdoor electronic cabinets, can be mounted comprises a shallow, box-like frame including rigid sides, bottom plates secured to the sides, and cross braces extending between and secured to opposite sides. For rigidity and strength, the cross braces comprise U-beams having upper and lower laterally extending flanges, the upper flanges serving as horizontal surfaces for the mounting of equipment on the support. In a preferred use, the support structure is placed on the ground at a cleared outdoor site and locally available ballast is loaded into the structure for firmly anchoring it in place.

20 Claims, 5 Drawing Sheets

6,095,482

UNIVERSAL EQUIPMENT MOUNTING STRUCTURE AND METHOD OF USING

BACKGROUND OF THE INVENTION

This invention relates to a support structure onto which various equipment, such as outdoor electronic cabinets, road side traffic control equipment, railroad switches, utility transformers and the like, can be directly mounted and secured. While the inventive structure can be used indoors, the most advantageous use of the support is for outdoor use and in direct replacement of ground supported concrete pads and the like normally used.

At outdoor sites at which equipment of the foregoing noted type are to be located, a typical practice is to clear the site, dig a shallow opening, and pour concrete or the like into the opening for providing a flat and firmly anchored pad or floor structure onto which various equipment can be mounted. The mounted equipment must be firmly secured in place and, typically, protected by a security fence. To these ends, various mounting brackets and the like are secured to the pads by such procedures as being force fitted into openings drilled into the pads. Regardless of the specific fixtures and procedures used, providing such support structures is expensive and time consuming. Also, at remote and difficult to reach sites, the problems of transporting the needed tools and materials to the sites can be enormous. The present invention greatly avoids these problems.

SUMMARY OF THE INVENTION

An equipment mounting structure comprises a shallow, box-like structure having strength, rigidity and light weight obtained by being formed from flanged side and cross-bracing members and a substantially continuous bottom wall formed from relatively thin plates. The structure has a substantially open top surface facilitating, in one use of the structure, the loading therein of ballast for firmly anchoring the structure to the ground. The flanges of the cross braces provide horizontal surfaces including spaced apart bolt receiving openings by means of which equipment can be stably mounted and bolted in place. In one embodiment, used for the mounting of telecommunication equipment storing cabinets, an enclosed trough having upwardly facing end openings is disposed between a pair of cross braces upon which a pair of spaced apart cabinets are mounted. The trough provides a protective enclosure for a cable passing between the two cabinets.

Preferably, the inventive structures include various structural features, described hereinafter, enabling use of commonly designed structures in different applications and with different equipment.

DESCRIPTION OF PREFERRED EMBODIMENTS OF THE INVENTION

While, as previously explained, the mounting structures according to the invention can be used for the mounting of a variety of equipment, a principal use of the mounting structures is with known outdoor cabinets used in the telecommunication industry. Traditionally, such cabinets, of metal and relatively heavy, are mounted on specially prepared concrete slabs and fully enclosed within security fences mounted on the slabs or on poles sunk into the ground surrounding the slabs.

As previously noted, a problem with providing such slabs, particularly acute at remote and difficult to reach sites, is that of transporting the necessary slab forming materials and tools to the site. The present invention greatly reduces this problem because, for one thing, a necessary and major component of the inventive structures, i.e., ballast in the form of stones, sand and the like, will typically be available on site and need not be transported thereto. An attendant feature of the inventive mounting structures is that while they have a large ballast carrying capacity for firm anchoring to the ground, such capacity is obtained without attendant great weight, hence other uses of the mounting structures, without ballast, are quite practical. This is described hereinafter.

Figure 1:
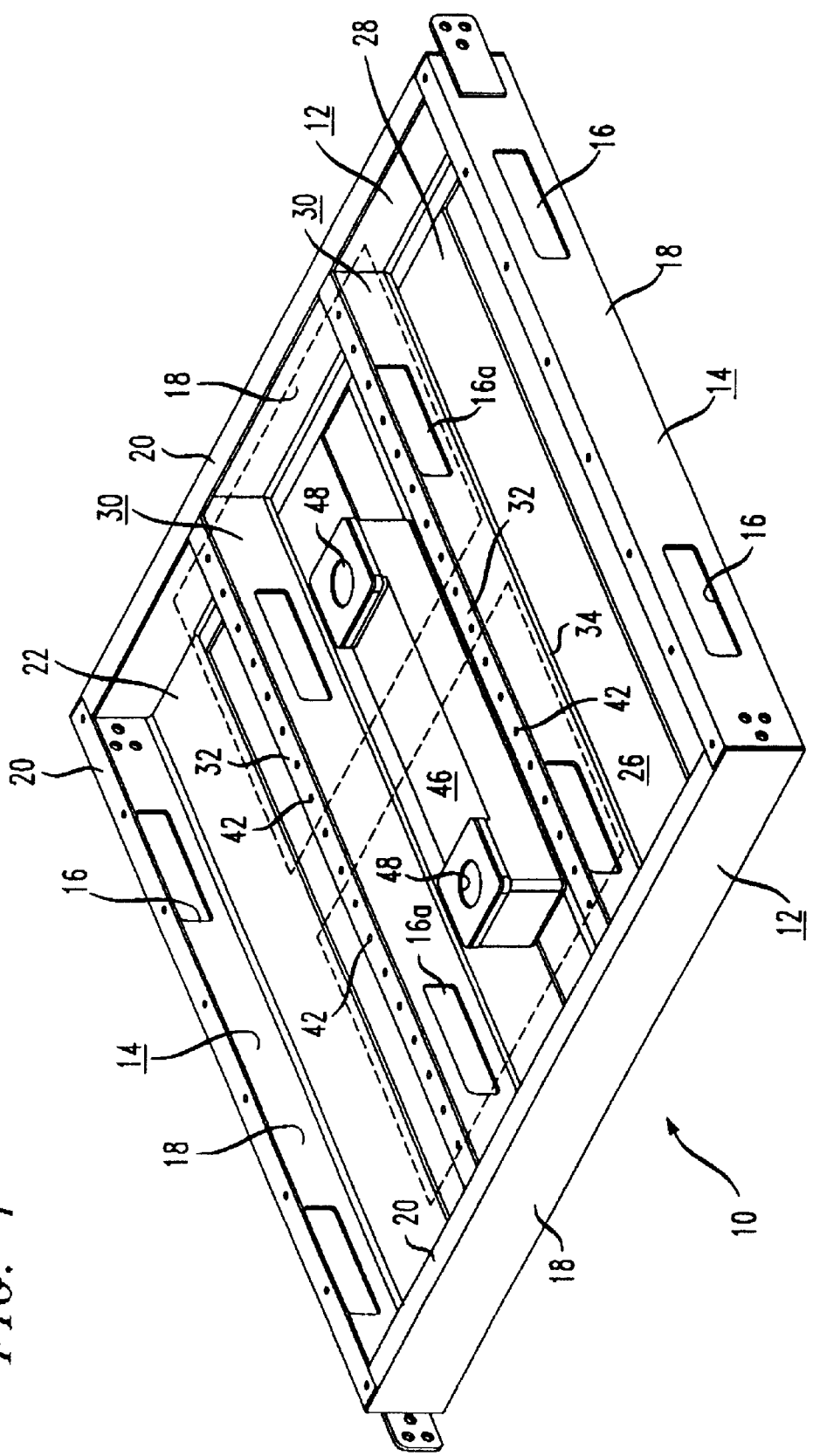
FIG. 1 is a view, in perspective, of a mounting structure in accordance with this invention intended for use with known telecommunication outdoor cabinets.

With reference to FIG. 1, a support structure 10 in accordance with the invention comprises two pairs of oppositely disposed side members 12 and 14 bolted together to form an outer side frame. The two side members 14 optionally contain slots 16 for receipt of the forks of a forklift for moving the structure 10. For greater strength and rigidity, the side members are channel-shaped, i.e., they each comprise a "vertical plate" 18 (in the horizontal orientation of the structure 10 as shown in the drawings) having elongated top and bottom edges and integral, elongated top 20 and bottom 22 flanges extending inwardly of the structure from the plate top and bottom edges, respectively. Conveniently, the bottom flanges 22 are quite wide relative to the top flanges 20. Reasons for this are that the relatively narrow flanges 20 provide strength (as well as mounting surfaces as hereinafter explained) while not unduly closing the upper opening into the structure (for ease of loading ballast into the structure), while the lower, wider flanges form part of a generally continuous bottom wall for receipt of the ballast.

Other portions of the bottom wall comprise thin, flat plates 28 extending between and overlying the bottom flanges 22 of the two side members 12. The ends of the plates 28 are bolted to the flanges 22. The bottom wall 26 provides strength and rigidity to the structure 10 while providing an enclosed area for receipt of ballast for securing the structure in place. For lightness of weight, the bottom wall plates, e.g., of steel, can be quite thin, particularly because the plates do not support the weight of the ballast but are anchored against the ground by the ballast.

Mounted on two of the bottom plates 28 and likewise secured to the two side members 12 are spaced apart bracing members 30, each being channel shaped and having elongated top 32 and bottom 34 flanges extending in a direction away from the space between the two bracing members. Each bracing member 30 contains a pair of slots 16a in alignment with the slots 16 through the side members 14 for receipt of the leading ends of a forklift fork. The vertical height of the two bracing members 30 is slightly less than that of the side members 12 such that the ends of the members 30 fit snugly between the top 20 and bottom 22 flanges of the side members 12. The two bracing members 30 are thus firmly and rigidly secured to the side members 12 for adding to the strength and rigidity of the structure 10.

The upper flanges 32 of the two bracing members 30 provide a flat, co-planer surface on which cabinets 40 (FIG. 2) or other equipment are mounted. To these ends, both flanges 32 are provided with spaced apart bolt receiving openings 42. For preselected use with cabinets of known design, only a few openings are actually required for mating with corresponding openings, or bolts, on the bases of the cabinets for bolting the cabinets in place. The extra openings provide flexibility of use of the structure 10 with various differently dimensioned equipment.

Figure 2:
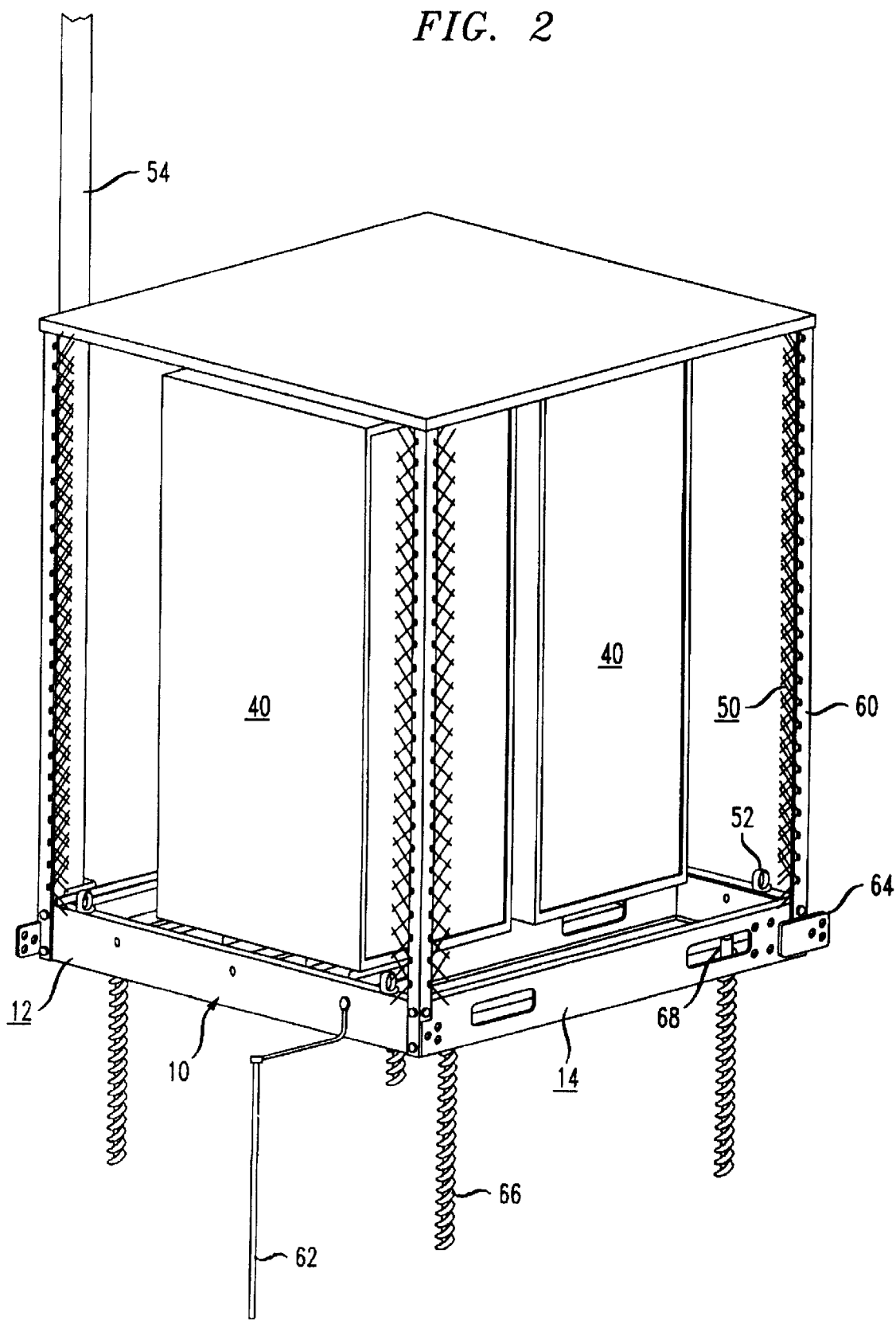
FIG. 2 is a view, in perspective, of the structure shown in FIG. 1 and showing, in addition to the afore-mentioned cabinets, various optional components readily mounted on the structure and useful in out-of-door applications.

As shown in FIG. 2, two cabinets 40 are mounted on and secured to the structure 10. The cabinets in this use of the mounting structure 10 house various optical and electrical components forming part of a telecommunication network, and the cabinets are interconnected within the network and to each other by various cables. A feature of the structure 10 is that it includes an enclosed conduit 46 (FIG. 1) for the cables extending between the two cabinets. The conduit 46 comprises an enclosed elongated metal box mounted on the bottom wall 26 of the structure 10 and between and parallel to the two bracing members 30. The height (FIG. 4) of the conduit 46 is slightly less than the height of the bracing members 30 on which the cabinets 40 are mounted, and the conduit has two upwardly facing openings 48 positioned to lie directly beneath respective cabinets 14. One or more cables (not shown) interconnecting the two cabinets 40 pass vertically beneath the two cabinets and laterally through the conduit 46.

While not illustrated herein, additional equipment typically present at an outdoor site, e.g. a power control box for the a.c. power applied, via cable, to the cabinets 40, can also be mounted on the support structure.

A feature of the structure 10 is its ease of assembly and on-site installation. Typically, a flat, ground exposing space is prepared, such preparation generally including removing material from the site, and the structure 10 shown in FIG. 1 is simply placed within the space and directly on the ground. Perfect ground flatness is preferred but not required. Then, with the structure 10 more or less firmly seated on the ground, ballast of practically any inert and stable material, e.g. locally prepared gravel (preferably, but not necessarily, of stones of small size), is poured or shoveled into the structure 10 for fully covering the bottom wall 26 of the structure. The weight of the ballast against the ground supported bottom wall 26 firmly anchors the structure 10 in place. Significantly, the ballast will be typically available near the site, thus reducing the amount of material which must be transported to the site. Ideally, the ballast is supplied from the very material removed during site preparation. The structure 10 is substantially fully filled with the ballast, for firmly anchoring it in place, while leaving uncovered various "working" surfaces of the structure, e.g., the upper flanges 32 of the bracing members 30 and the openings 48 into the conduit 46. When ballasted, the structure 10 comprises a fixed outdoor site for receipt of various outdoor equipment, e.g., the cabinets 40 shown in FIG. 2, and various auxiliary structures, e.g., a surrounding fence 50 partially shown in FIG. 2.

Typical telecommunication cabinets, such as the cabinets 40 in the present example, house heat generating equipment and, during normal operation, heat is removed from the cabinet, particularly during daylight hours. In some instances, the difference in temperature within the cabinets between day and night time operation is so great that, ideally, heat should be added to the cabinets at night to reduce the temperature cycling seen by the housed components (excessive temperature variations generally leading to reduced component lifetimes). Typically, the cabinets are cooled by forced circulation of outside air past heat exchangers for transferring cabinet internal energy to the forced circulating outside air. An advantage of ballasted structures in accordance with this invention is that ballast, in contrast to poured concrete, is quite porous and can serve as a heat sink for adding to or removing heat from the circulating air.

Figure 6:
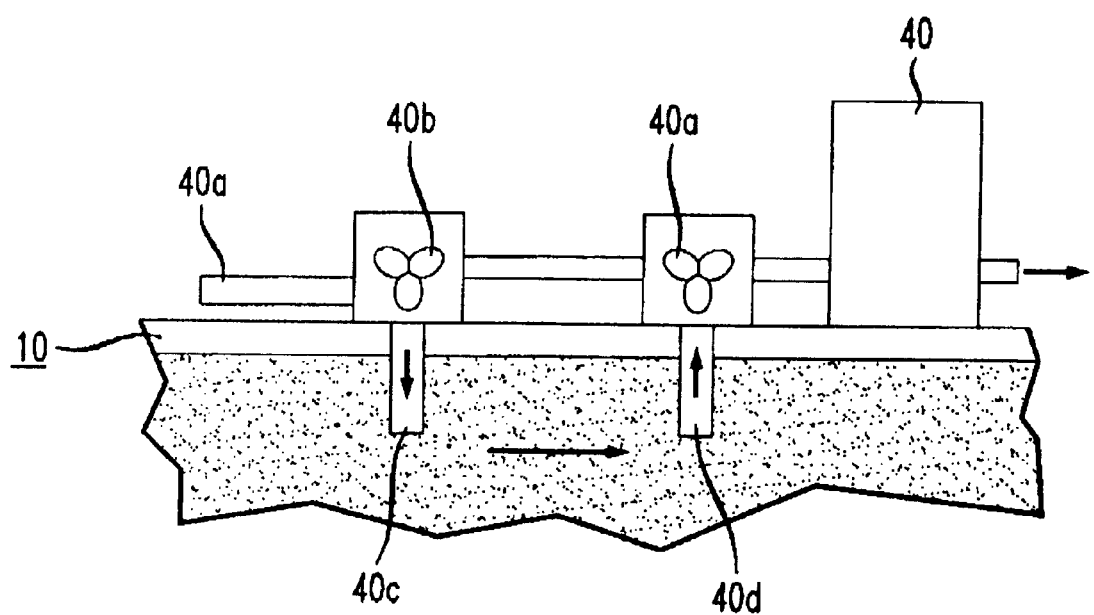
FIG. 6 is a schematic side-sectional view of a ballast containing mounting structure and means for using the ballast as a heat sink.

Thus, as indicated schematically in FIG. 6, outside air is drawn through an inlet duct 40a by fans 40b which direct the air downwardly through an open-ended duct 40c for circulation within the ballast which, if not deliberately compacted, is typically quite porous. The circulating air is largely captured by an exhaust air duct 40d which circulates the air through a heat exchanger 40e in communication with the cabinet 40. During daylight hours, the ambient air is cooled by the ballast (having a large thermal mass) for more efficient cooling of the cabinet. During much cooler night time hours, the ambient air is heated by the ballast (from heat transferred thereto by the daytime air) and is used to add heat to the cabinet, but just to the extent for minimizing the temperature cycling within the cabinet.

Except for the ducts 40c and 40d leading into the ballast, the air circulating system shown in FIG. 6 is mounted directly on the structure 10 or is mounted directly on the cabinets. Preferably, after disposition of the support structure at a site, the structure is partially filled with ballast, the equipment mounted on the structure with the air ducts 40c and 40d extending towards the surface of the previously provided ballast, and additional ballast is then added for burying the open ends of the ducts beneath the surface of the ballast.

A feature of the mounting structure 10 is the number of structural elements which can be optionally incorporated, at little expense, in the basic structure 10 shown in FIG. 1, for greatly enhancing the use and handling of the structure 10. Examples of such optional elements are now described.

The various aligned openings 16 and 16a through the side members 14 and the bracing members 30 provide, as previously noted, secure lifting surfaces for a fork lift. Similarly, rings 52 welded to the structure 10, e.g. on the upper flanges 20 of the side members 12, provide lifting points for secure engagement by a crane hoist. The upper flanges 32 of the bracing members 30 have, as previously noted, spaced apart bolt receiving openings 32 along the full lengths of the members 30 for the secure mounting of different sized equipment on the structure. Similar bolt receiving openings 32 are provided in the side members 14 and at the corners of the structure 10.

Figure 3:
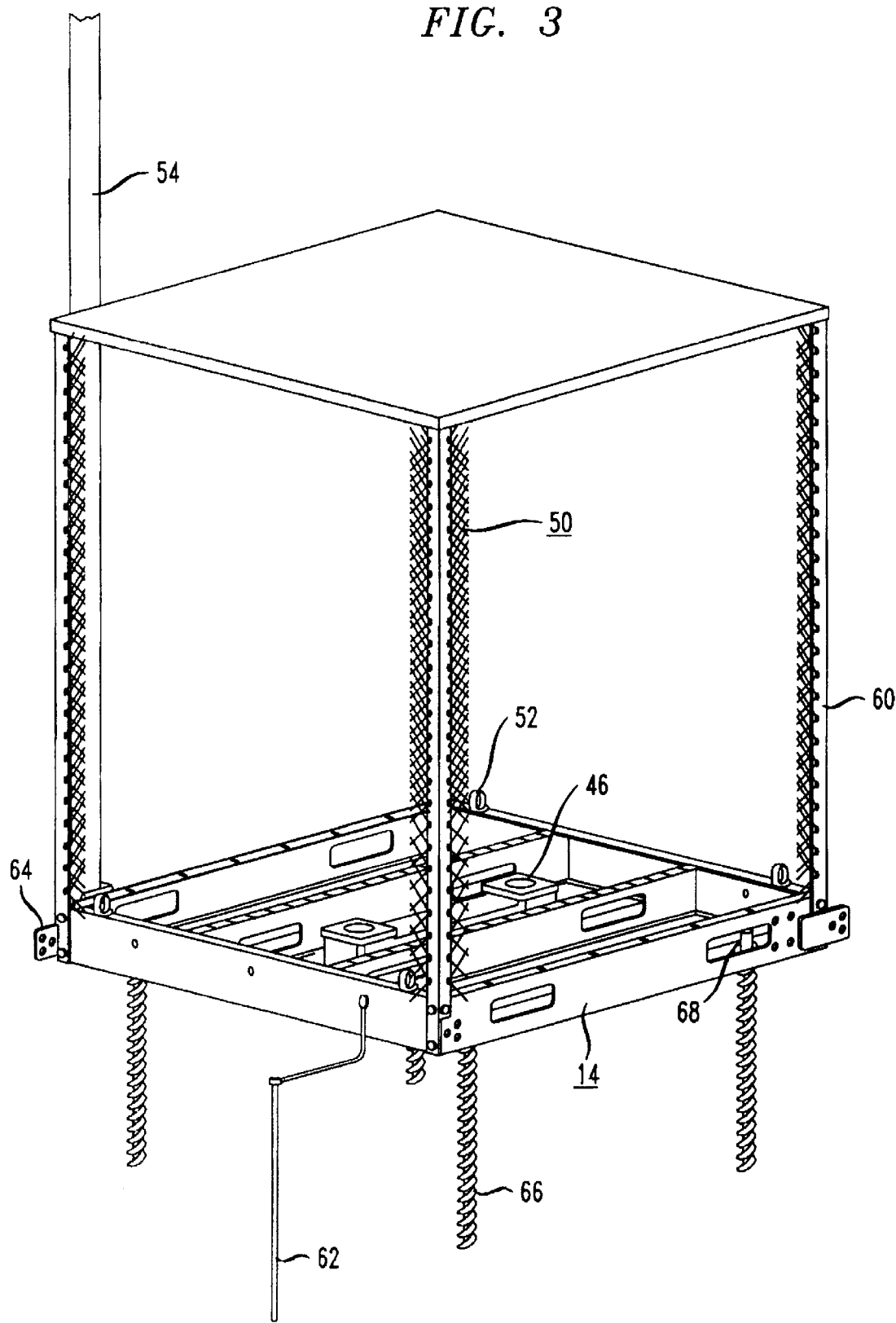
FIG. 3 is view similar to FIG. 2 but omitting the cabinets.

FIGS. 2 and 3 show an antenna 54 rigidly secured to one of the structure side members 14. Similarly, vertical, L-shaped posts 60 for the aforementioned security fence 50 can be secured, for example, at each corner of the structure. Grounding rods 62 can be readily bolted to the side members 12 and/or 14 for electrically grounding the entire structure for lightning protection. FIG. 2 shows small, laterally extending, apertured plates 64 useful for bolting together adjoining structures 10 for larger dimensioned mounting sites.

FIG. 2 additionally shows elongated screws 66 extending downwardly through nuts 68 welded to the bottom wall at openings through the bottom wall. The screws are screwed through the nuts and into the earth for more rigidly and firmly anchoring the structure 10 in place. Normally, and dependent upon the dimensions of the structure and the weight of the ballast used therein, the combined weight of the equipment mounted and ballasted structure 10 is sufficient to prevent movements (e.g., overturning) in high winds. The anchoring screws are useful in areas exposed to exceptionally high winds or subject to earthquakes.

A further feature of the inventive structures 10 is that they can be used in situations not requiring anchoring by ballast. That is, because of the strength and rigidity of the structures, along with their lightness of weight, owing to the framed constructions, the structures can be used indoors bolted to a floor or suspended by corner connected cables from a building roof.

Figure 4:
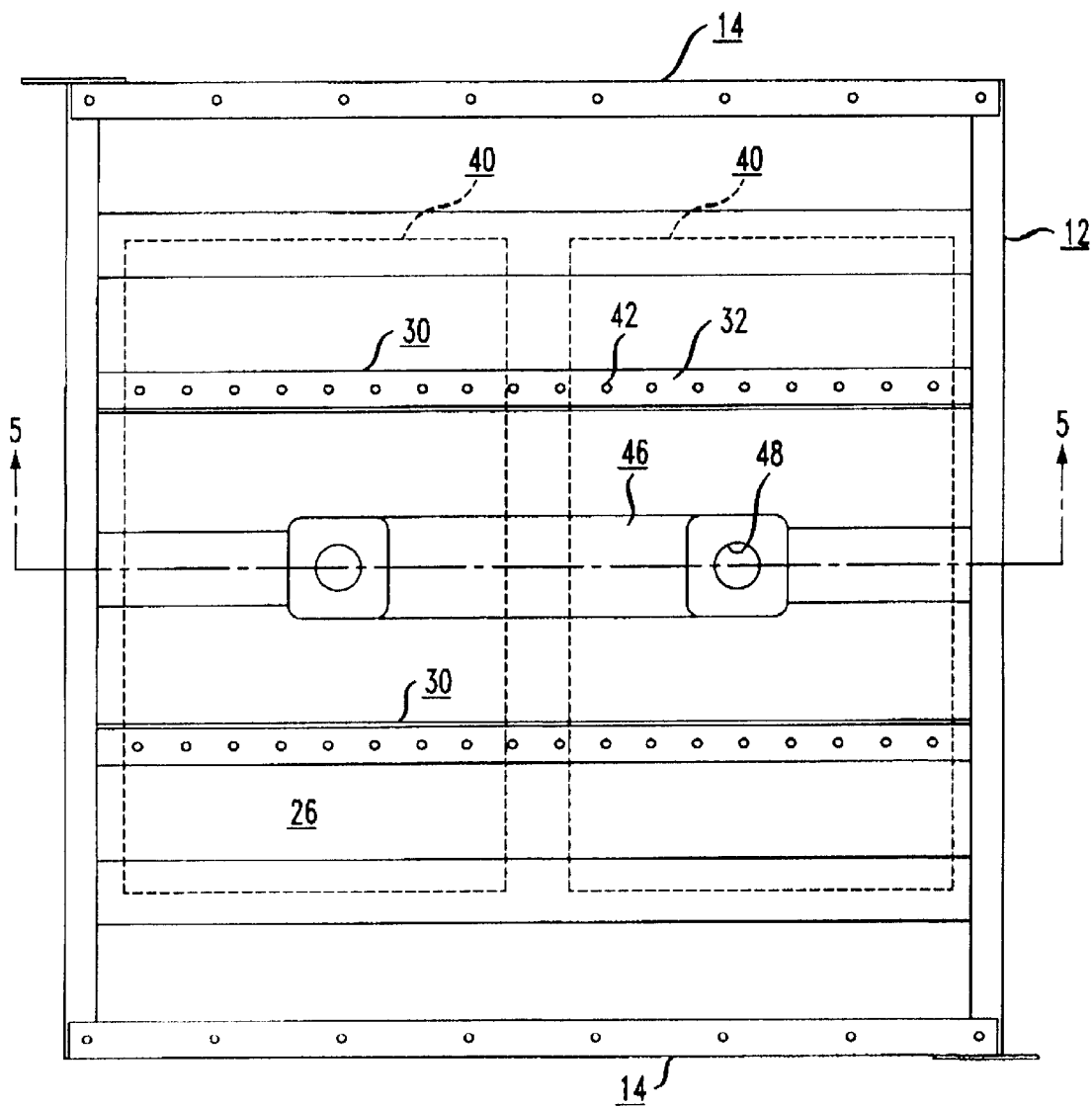
FIG. 4 is a plan view of the mounting structure shown in FIG. 1.
Figure 5:
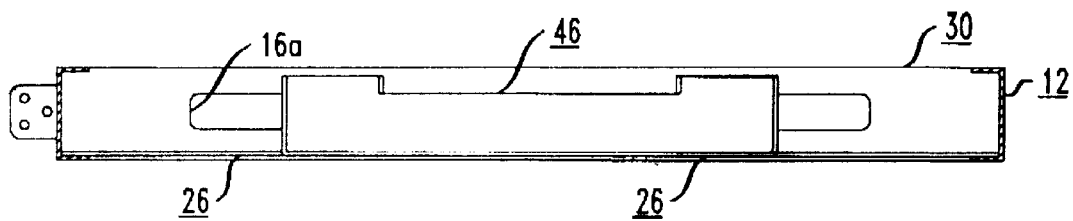
FIG. 5 is a side-sectional view of the mounting structure taken along line 5—5 of FIG. 4.

As shown in FIG. 2, the lateral dimensions of the structure 10 are significantly greater than that of the cabinets 40 mounted thereon (see, also, FIG. 4). With the cabinets bolted in place, the larger lateral dimensions of the structure 10 provide greater stability against overturning of the cabinets, e.g., in a high wind. Also, the greater dimensions of the structure provide for a spreading of the weight loading of the cabinets over a larger floor area. This allows the cabinets (or other heavy equipment) to be installed on structures, e.g., within buildings, not designed for concentrated floor loads.

The structure 10 can be substantially completely preassembled, including the equipment, such as the cabinets 40, firmly mounted thereon and pre-wired, for transport as an integral, ready-to-use unit to a site. This allows extremely rapid deployment of heavy equipment needed in emergency situations of natural disasters and the like.

What is claimed is:

1. An equipment mounting support structure having a shallow, box-like configuration including rigid sides, a bottom plate attached to sides of the structure, a first cross brace extending between opposite sides of the structure and mounted on said bottom plate, an upper surface of said cross brace including a structural element for the receipt and securing of an equipment mounted on the structure, and an enclosed trough disposed on said bottom plate, said trough having upwardly facing end openings for receipt of a cable passing through said trough and dependent from spaced apart portions of equipment mounted on said cross brace and overlying said trough.

2. A structure according to claim 1 wherein said cross brace comprises an elongated, vertical plate having top and bottom elongated flanges extending perpendicularly from respective top and bottom elongated edges of said vertical plate.

3. A structure according to claim 1 including a second cross brace substantially identical to said first brace and similarly mounted as said first cross brace but in spaced apart, parallel relation to said first cross brace, said enclosed trough being disposed between said cross braces and extending parallel thereto.

4. A structure according to claim 1 wherein said structure sides comprise channel-shaped members, each including an elongated vertical plate having top and bottom elongated flanges extending inwardly of said structure from top and bottom elongated edges of said vertical plate, said bottom flanges forming part of a bottom wall including bottom plates, and the widths of the bottom flanges of an opposed first pair of said side members being greater than the widths of the bottom flanges of a second pair of said side members extending perpendicularly to said first pair of side members.

5. A structure according to claim 4 wherein said bottom plates are disposed in side-by-side relationship extending in directions parallel to said first pair of side members.

6. A structure according to claim 5 wherein ends of said bottom plates overlap and are secured to the bottom flanges of said second pair of side members.

7. A structure according to claim 6 wherein said first and second cross braces extend in directions parallel to said first pair of side members, ends of said cross braces overlapping and fitting snugly between the top and bottom flanges of respective ones of said second pair of side members and being secured to said flanges.

8. A structure according to claim 1 including ballast resting on said bottom plate for weight anchoring the structure against an underlying support surface.

9. A structure according to claim 8 including equipment mounted on the structure comprising: a cabinet housing heat producing components; A air circulator for controlling the temperature of the cabinet by circulating ambient air, and air conduits for circulating the temperature controlling air through the ballast.

10. A method of fixedly installing equipment at an outdoor site comprising the steps of: a) disposing a support structure on the ground at the site, the support structure having a shallow, box-like configuration including rigid sides, a bottom plate attached to sides of the structure, and spaced apart top surfaces providing mounting surfaces for the equipment to be installed; b) then loading ballast into the structure through a space between said top surfaces and onto said bottom plate for fixedly weight anchoring the structure in place; and c) mounting the site equipment onto, and fixedly securing the equipment to, said mounting surfaces.

11. A method according to claim 10 including only partially filling the structure with ballast for leaving said mounting structure uncovered by the ballast, mounting said equipment on said mounting surfaces, and completing the filling of the structure with ballast to a level for at least partially contacting and surrounding a bottom end of said mounted equipment for thermally connecting the ballast to the mounted equipment.

12. A method according to claim 10 and prior to the loading of ballast into the structure, driving helical screws through bolts on a bottom portion of the structure and into the ground for more firmly anchoring the structure in place.

13. A method according to claim 10 including mounting said equipment on said structure at a location other than the site where the equipment is to be installed, and transporting the structure with the equipment mounted thereon as an integral unit for disposition at said site.

14. A method according to claim 10 wherein said step (b) comprises loading a particulate ballast into the structure.

15. A method according to claim 14 including circulating air in heat exchanging relationship through the ballast, and using the ballast circulated air for controlling the temperature of the equipment installed at said outdoor site.

16. A method of installing equipment at an outdoor site comprising the steps of: a) disposing a support structure on the ground at the site, the support structure having a shallow, box-like configuration including rigid sides, bottom plates attached to sides of the structure, and spaced apart top surfaces providing mounting surfaces for the equipment to be installed; b) loading ballast into the structure through a space between said top surfaces and onto said bottom plates for weight anchoring the structure in place; and c) mounting the site equipment onto, and securing the equipment to, said mounting surfaces, and including the step of clearing the ground at the site for preparing a relatively flat ground space for receipt of the structure, and using materials cleared from the site as the structure ballast.

17. An equipment mounting support structure disposed at an outdoor site, the structure having a shallow, box-like configuration including rigid sides and a bottom plate attached to a side of the structure, a telecommunications equipment containing cabinet fixedly mounted on the structure, and a ballast covering the bottom plate fixedly weight anchoring the support and the cabinet mounted thereon at said site.

18. A structure according to claim 17 wherein said ballast comprises a particulate material.

19. A structure according to claim 18 including a first cross brace extending between sides of the structure, said cabinet being mounted on a surface of said cross brace disposed at a first distance above said bottom plate, and said ballast extending to a height above said bottom plate not in excess of said first distance.

20. A structure according to claim 19 wherein said cabinet includes a bottom surface in direct and heat exchanging contact with said ballast.

* * * * *